US009899418B2

(12) United States Patent
Pfeuffer et al.

(10) Patent No.: US 9,899,418 B2
(45) Date of Patent: Feb. 20, 2018

(54) DISPLAY DEVICE AND METHOD FOR PRODUCING A DISPLAY DEVICE

(71) Applicant: OSRAM Opto Semiconductors GmbH, Regensburg (DE)

(72) Inventors: Alexander F. Pfeuffer, Regensburg (DE); Norwin Von Malm, Nittendorf (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 14/652,089

(22) PCT Filed: Nov. 29, 2013

(86) PCT No.: PCT/EP2013/075122
§ 371 (c)(1),
(2) Date: Jun. 12, 2015

(87) PCT Pub. No.: WO2014/090605
PCT Pub. Date: Jun. 19, 2014

(65) Prior Publication Data
US 2015/0325598 A1    Nov. 12, 2015

(30) Foreign Application Priority Data

Dec. 14, 2012 (DE) .............. 10 2012 112 302

(51) Int. Cl.
*H01L 27/12* (2006.01)
*H01L 25/16* (2006.01)
(Continued)

(52) U.S. Cl.
CPC ........ *H01L 27/1222* (2013.01); *H01L 25/167* (2013.01); *H01L 27/1274* (2013.01);
(Continued)

(58) Field of Classification Search
CPC .............. H01L 33/382; H01L 27/1222; H01L 27/1274; H01L 27/156; H01L 25/167
See application file for complete search history.

(56) References Cited

U.S. PATENT DOCUMENTS

| 5,696,389 A | 12/1997 | Ishikawa et al. |
| 5,789,766 A | 8/1998 | Huang et al. |

(Continued)

FOREIGN PATENT DOCUMENTS

| CN | 1964081 A | 5/2007 |
| CN | 101960601 A | 1/2011 |

(Continued)

OTHER PUBLICATIONS

"Thin Film Transistor", Hanyang University; Nono Hybrid Thin Flim Lab.; Apr. 19, 2008, pp. 1-30.
(Continued)

*Primary Examiner* — Jose R Diaz
(74) *Attorney, Agent, or Firm* — McDermott Will & Emery LLP

(57) ABSTRACT

The invention relates to a display device, comprising a layer stack, which comprises a semiconductor layer sequence having an active region for producing radiation and comprises a circuit layer. The semiconductor layer sequence forms a plurality of pixels. For each pixel, a respective switch connected in an electrically conductive manner to the pixel is formed in the circuit layer. The invention further relates to a method for producing a display device.

21 Claims, 11 Drawing Sheets

(51) Int. Cl.
*H01L 27/15* (2006.01)
*H01L 25/075* (2006.01)
*H01L 33/24* (2010.01)
*H01L 33/38* (2010.01)
*H01L 33/62* (2010.01)

(52) U.S. Cl.
CPC ........ *H01L 27/156* (2013.01); *H01L 25/0753* (2013.01); *H01L 33/24* (2013.01); *H01L 33/382* (2013.01); *H01L 33/385* (2013.01); *H01L 33/62* (2013.01); *H01L 2924/0002* (2013.01)

(56) References Cited

U.S. PATENT DOCUMENTS

| | | | | |
|---|---|---|---|---|
| 8,436,373 | B2* | 5/2013 | Mizutani | H01L 27/156 257/100 |
| 8,643,034 | B2* | 2/2014 | Engl | H01L 27/156 257/446 |
| 2005/0073248 | A1 | 4/2005 | Haerle et al. | |
| 2010/0213467 | A1 | 8/2010 | Lee et al. | |
| 2011/0297975 | A1* | 12/2011 | Yeh | G03B 21/005 257/88 |
| 2016/0027765 | A1* | 1/2016 | von Malm | H01L 25/167 257/72 |

FOREIGN PATENT DOCUMENTS

| | | |
|---|---|---|
| CN | 102089893 A | 6/2011 |
| CN | 102341740 A | 2/2012 |
| CN | 104011864 A | 8/2014 |
| DE | 102004002446 A1 | 9/2004 |
| DE | 102008011848 A1 | 9/2009 |
| DE | 10 2008 062 933 A1 | 7/2010 |
| EP | 1596441 A2 | 11/2005 |
| WO | 2010/014032 A1 | 2/2010 |
| WO | WO-2010072191 A1 | 7/2010 |
| WO | 2010/149027 A1 | 12/2010 |
| WO | 2013/092304 A1 | 6/2013 |

OTHER PUBLICATIONS

Lee, V. et al.; "Lumiode light engines"; vincentlee@lumiode.com <mailto:vincentlee@lumiode.com>, pp. 1-26.

Lee, V. W. et al.; "A Passive-Matrix Inorganic LED Array as a Projection Source"; Department of Electrical Engineering, Columbia University, New York, NY, pp. 1-3.

Day, J. et al.; "III-Nitride full-scale hight-resolution microdisplays"; Applied Physics Letters, vol. 99, 031116, 2011, pp. 031116-1 to 031116-3.

* cited by examiner

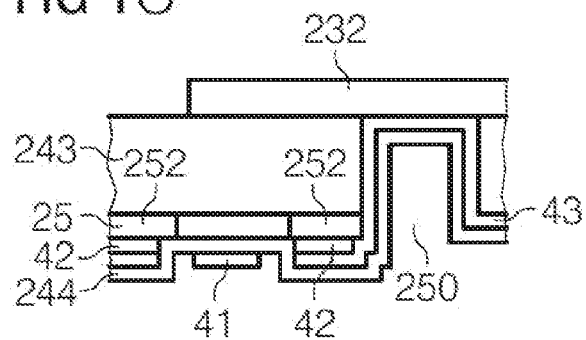
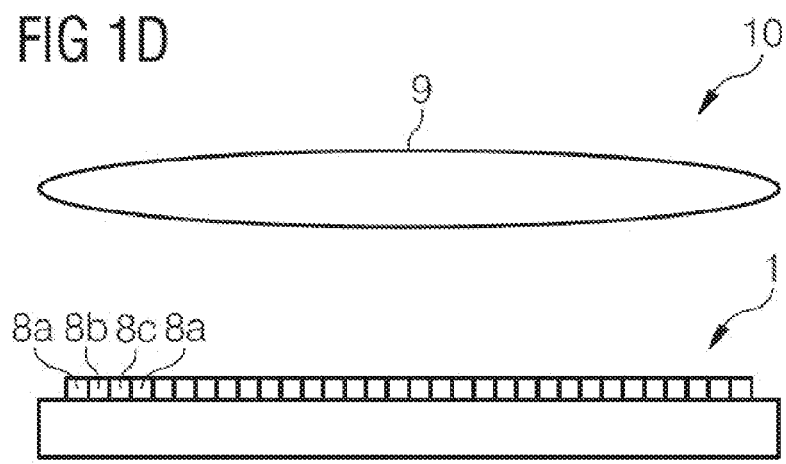
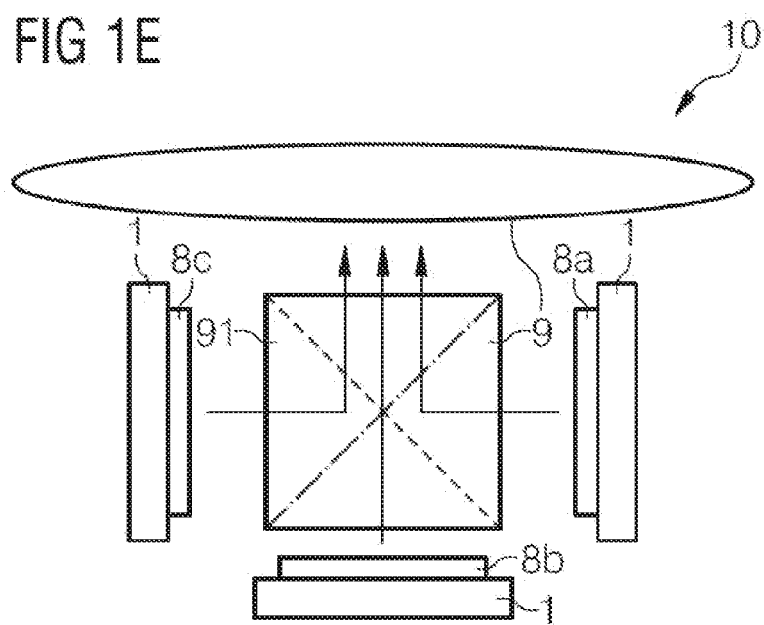

DISPLAY DEVICE AND METHOD FOR PRODUCING A DISPLAY DEVICE

BACKGROUND OF THE INVENTION

The present application relates to a display device and to a method for producing a display device.

Light emitting diodes can be employed for producing display devices, in the case of which light emitting diodes an individually drivable LED respectively forms a pixel. With the use of a so-called passive matrix, the pixels are contacted via row and column lines. In the case of this approach, however, a plurality of light emitting diodes cannot be operated simultaneously, with the result that the luminosity of the entire display device can maximally be of the same magnitude as the luminosity of an individual pixel.

Alternatively, a so-called active matrix circuit can be employed, in the case of which a plurality of pixels can also be operated in parallel, that is to say simultaneously. In order to produce such display devices, the driver elements for driving and the radiation emitting LED structures are produced on separate carriers and connected to one another by means of an aligned bonding process. However, such a bonding process is complex and, with increasing miniaturization of the pixels, makes ever greater requirements of the alignment accuracy during the bonding process.

SUMMARY OF THE INVENTION

One object is to specify a display device which is distinguished by a high luminosity and at the same time can be produced in a simple manner.

Furthermore, the intention is to specify a method by which a display device can be produced in a simple and reliable manner.

This object is achieved, inter alia, by means of a display device and respectively a method according to the independent patent claims. Further configurations and expediencies are the subject matter of the dependent patent claims.

In accordance with at least one embodiment of the display device, the display device comprises a layer stack. A layer stack is understood to be an arrangement of layers arranged one on top of another, in particular deposited one on top of another. The individual layers can be unstructured or structured in a lateral direction.

In case of doubt, a lateral direction is understood to be a direction running parallel to a main extension plane of the layer stack.

In particular, the structuring of one of the layers of the layer stack can be carried out between the deposition of a first layer and the deposition of a second layer of the layer stack. Different deposition processes can also be employed for the deposition of the individual layers.

By contrast, two prefabricated elements that are subsequently fixed to one another, for example by means of a connecting layer, do not form a layer stack within the meaning of the present application.

In accordance with at least one embodiment of the display device, the display device, in particular the layer stack, comprises a semiconductor layer sequence having an active region provided for generating radiation. The active region can be provided for generating radiation in the visible, ultraviolet or infrared spectral range. Preferably, the semiconductor layer sequence, in particular the active region, contains a III-V compound semiconductor material. III-V compound semiconductor materials are particularly suitable for generating radiation in the ultraviolet ($Al_xIn_yGa_{1-x-y}N$) through the visible ($Al_xIn_yGa_{1-x-y}N$, in particular for blue to green radiation, or $Al_xIn_yGa_{1-x-y}P$, in particular for yellow to red radiation) to the infrared ($Al_xIn_yGa_{1-x-y}As$) spectral range. Here $0 \leq x \leq 1$, $0 \leq y \leq 1$ and $x+y \leq 1$, in each case hold true, in particular where $x \neq 1$, $y \neq 1$, $x \neq 0$ and/or $y \neq 0$. With III-V compound semiconductor materials, in particular from the material systems mentioned, high internal quantum efficiencies can furthermore be obtained in the generation of radiation.

The semiconductor layer sequence forms a plurality of pixels of the display device. The pixels are arranged alongside one another in a lateral direction, for example in a matrix-shaped fashion.

In a vertical direction, that is to say perpendicularly to the main extension plane of the semiconductor layers of the semiconductor layer sequence, the semiconductor layer sequence extends in particular between a radiation exit surface and a rear side situated opposite the radiation exit surface.

By way of example, the semiconductor layer sequence comprises a first semiconductor layer and a second semiconductor layer, wherein the active region is arranged between the first semiconductor layer and the second semiconductor layer. The first semiconductor layer and the second semiconductor layer expediently differ from one another with regard to their conduction type. By way of example, the first semiconductor layer can be embodied as p-conducting and the second semiconductor layer as n-conducting, or vice-versa.

The active region is embodied for example as a pn junction or as a quantum structure. In the context of the application, the designation quantum structure encompasses in particular any structure in which charge carriers can experience a quantization of their energy states as a result of confinement. In particular, the designation quantum structure does not include any indication about the dimensionality of the quantization. It therefore encompasses, inter alia, quantum wells, quantum wires and quantum dots and any combination of these structures.

In accordance with at least one embodiment of the display device, the display device, in particular the layer stack, comprises a circuit layer. A switch is formed in the circuit layer for each pixel. The switch is electrically conductively connected to the respective pixel. By way of example, the switches are electrically conductively connected in each case to the first semiconductor layer or to the second semiconductor layer of the assigned pixels. By way of example, the first semiconductor layer is arranged between the active region and the circuit layer. The circuit layer is expediently arranged on that side of the semiconductor layer sequence which faces away from the radiation exit surface. An insulation layer is arranged in particular at least regionally between the circuit layer and the semiconductor layer sequence. The insulation layer can adjoin in particular the semiconductor layer sequence and the circuit layer. By way of example, cutouts through which the pixels are electrically conductively connected to the switch are formed in the insulation layer.

In at least one embodiment of the display device, the display device comprises a layer stack, which comprises a semiconductor layer sequence having an active region provided for generating radiation and comprises a circuit layer. The semiconductor layer sequence forms a plurality of pixels and a switch is formed in the circuit layer for each pixel, said switch being electrically conductively connected to the respective pixel.

The active region provided for generating radiation and the circuit layer, in which the switches for controlling the pixels are formed, are therefore integrated into a common layer stack. A bonding process in which the prefabricated active regions and the switches, prefabricated in particular separately therefrom, are connected to one another can be dispensed with during the production of the display device. The miniaturization of the display device is simplified as a result. The reliability of production is furthermore increased.

In particular, the pixels can have an edge length of between 2 μm and 300 μm inclusive, preferably between 2 μm and 50 μm inclusive, particularly preferably between 2 μm and 10 μm inclusive. The smaller the pixels, the greater the resolution of the display device can be for the same lateral extent. Alternatively, the same resolution of the display device can be obtained for a smaller lateral extent. As a result, more display devices can be produced simultaneously, for instance from a wafer assemblage.

Furthermore, the respectively assigned switches can be arranged in each case behind the pixels, that is to say on that side of the semiconductor layer sequence which faces away from the radiation exit surface. In particular, the entire drive circuit can be arranged behind the pixels. In comparison with an arrangement of parts of the drive circuit between adjacent pixels, the risk of shading by the drive circuit can be avoided.

In accordance with at least one embodiment of the display device, the display device is free of a cohesive connection between the semiconductor layer sequence and the circuit layer. In the case of a cohesive connection, the in particular prefabricated connection partners are held together by means of atomic or molecular forces. A cohesive connection can be formed for example by means of a connecting layer, for instance a solder layer or an adhesive layer. The separation of a cohesive connection is typically accompanied by the destruction of the connecting layer and/or of at least one of the connection partners. In contrast thereto, individual layers deposited one on top of another should not be regarded as elements which are connected to one another by means of a cohesive connection.

In accordance with at least one embodiment of the display device, the circuit layer comprises a polycrystalline semiconductor material. By way of example, the circuit layer can contain polycrystalline silicon or consist of such a material. The circuit layer can furthermore comprise one or a plurality of doped regions.

In comparison with amorphous semiconductor material, polycrystalline or monocrystalline semiconductor material can have a greatly increased charge carrier mobility. By way of example, a charge carrier mobility that is half of the value for monocrystalline material or more can be achieved as a result of the recrystallization of amorphous silicon. Monocrystalline silicon typically has a charge carrier mobility of 400 to 500 $cm^2/Vs$. The use of polycrystalline semiconductor material instead of amorphous semiconductor material therefore makes it possible, in a simplified manner, to form switches in the circuit layer which are able also to switch the currents required for the generation of radiation in the pixels of the display device.

As an alternative thereto, the circuit layer can comprise an amorphous semiconductor material having a high charge carrier mobility, that is to say having a charge carrier mobility of at least 100 $cm^2/Vs$ for at least one charge carrier type. By way of example, indium gallium zinc oxide (IGZO) can be applied by means of MOCVD or sputtering. This material is distinguished by a high electron mobility and furthermore by low leakage currents.

In accordance with at least one embodiment of the display device, the semiconductor layer sequence and the circuit layer comprise in a lateral direction in each case a periodically repeating structure having a unit cell, wherein in the lateral direction an extent of the unit cell of the circuit layer is less than or equal to an extent of the unit cell of the semiconductor layer sequence. A center-to-center distance between two adjacent pixels is therefore not determined by the lateral extent of the drive circuit for the respective pixels, but rather only by the lateral extent of the pixels themselves and, if appropriate, the distance between them.

In accordance with at least one embodiment of the display device, the pixels in each case completely cover the assigned switches in a plan view of the display device. The switches therefore do not project beyond the pixels in a lateral direction. The distance between the adjacent pixels can thus be minimized in a simplified manner.

In accordance with at least one embodiment of the display device, the layer stack comprises a mirror layer. The mirror layer is arranged in particular between the semiconductor layer sequence and the circuit layer. The mirror layer is provided in particular for reflecting the radiation generated in the active region during the operation of the display device. Radiation emitted in the direction of the circuit layer can be reflected at the mirror layer and subsequently emerge through the radiation passage surface. Preferably, the mirror layer has a reflectivity of at least 60%, preferably of at least 70%, for a peak wavelength of the radiation generated in the active region. In particular, the mirror layer is embodied as a metallic mirror layer. The mirror layer furthermore preferably serves additionally for injecting charge carriers into the semiconductor layer sequence. The mirror layer can be embodied as a single layer or in a multilayered fashion. The mirror layer can directly adjoin the semiconductor layer sequence. Alternatively, a layer containing a TCO material can be arranged between the semiconductor layer sequence and the mirror layer. TCO (transparent conductive oxide) materials are transparent conductive oxides. By way of example, the TCO material can contain zinc oxide or indium tin oxide (ITO) or consist of such a material. In order to increase the electrical conductivity, the TCO material can furthermore be doped.

In accordance with at least one embodiment of the display device, the semiconductor layer sequence is fixed to a carrier. Preferably, the circuit layer is arranged between the semiconductor layer sequence and the carrier. The carrier is therefore arranged on that side of the circuit layer which faces away from the semiconductor layer sequence. The carrier itself can be free of electronic elements for the drive circuit. However, wiring elements, for example conductor tracks or electrically conductively filled perforations, can be arranged or formed in the carrier or on the carrier. By way of example, the carrier is embodied as an electrically insulating carrier.

In accordance with at least one embodiment of the display device, the display device, in particular the layer stack, comprises a first connection layer, which is electrically conductively connected to the first semiconductor layer. The first connection layer is arranged in particular outside the semiconductor layer sequence and serves for making electrical contact with the first semiconductor layer.

In accordance with at least one embodiment of the display device, the display device, in particular the layer stack, comprises a second connection layer, which is electrically conductively connected to the second semiconductor layer. The second connection layer is arranged in particular outside the semiconductor layer sequence and serves for making electrical contact with the second semiconductor layer.

The first connection layer and/or the second connection layer can be arranged at least regionally between the semiconductor layer sequence and the circuit layer.

In accordance with at least one embodiment of the display device, the active region extends continuously over at least two adjacent pixels, in particular over all the pixels. A structuring of the semiconductor layer sequence for severing the active regions for the formation of the pixels is therefore not necessary.

In accordance with at least one embodiment of the display device, the active region is subdivided into individual segments which in particular in each case form a pixel. In this case, the active region is therefore severed, for example by trenches formed in each case between adjacent active regions. A spatially delimited energization of the active regions in a lateral direction can be obtained in a simplified manner by means of the trenches. The trenches can extend in a vertical direction completely or only partly through the semiconductor layer sequence.

In accordance with at least one embodiment of the display device, the segments are electrically contacted along a circumference, in particular along the entire circumference, of the segments. By way of example, the second semiconductor layer of the segments is electrically contacted along the circumference. In particular, a connection layer for the electrical contacting of the second semiconductor layer, for instance the second connection layer, is led over a side surface of the segment. The second connection layer runs in a lateral direction in particular regionally between the active regions of two adjacent segments. In particular, the connection layer at least partly covers the active region in a lateral direction.

In accordance with at least one embodiment of the display device, the semiconductor layer sequence has at least one recess which extends from the circuit layer through the active region. By way of example, the at least one recess can extend through the first semiconductor layer and the active region and end in the second semiconductor layer.

By means of the at least one recess, charge carriers of both conduction types, that is to say electrons and holes, can be injected from the rear side of the semiconductor layer sequence from different sides into the active region and recombine there with emission of radiation. Contact layers arranged on the radiation exit surface for making electrical contact with the semiconductor layer sequence are therefore not necessary.

In accordance with at least one embodiment of the display device, each pixel has at least one recess which extends from the circuit layer through the active region. By way of example, each pixel has exactly one recess, which overlaps the centroid of the pixel in a plan view of the display device. Particularly in the case of comparatively large pixels, however, each pixel can also have more than one recess.

In accordance with at least one embodiment of the display device, the pixels on one side of the active region are connected to a common contact, for instance a ground contact. The other side of the active region is expediently connected to the switch. In particular, the pixels on one side of the active region are connected to a common connection layer. In other words, all first semiconductor layers of the pixels or all second semiconductor layers of the pixels are electrically conductively connected to a common contact, in particular to a common connection layer. By way of example, either the first connection layer or the second connection layer is the common connection layer.

In accordance with at least one embodiment of the display device, the common connection layer extends over the whole area over the radiation exit surface of the semiconductor layer sequence and adjoins in particular the radiation exit surface. By way of example, the second connection layer is the common connection layer. In this case, the second connection layer is expediently transmissive to the radiation generated in the active region. By way of example, the second connection layer contains a TCO material.

In accordance with at least one embodiment of the display device, the first semiconductor layer at least regionally covers a side surface of the second semiconductor layer. The area that can be utilized overall for the generation of radiation is therefore enlarged.

In order to produce such pixels, the semiconductor layer sequence can be epitaxially grown already in a structured fashion. A subsequent severing of the semiconductor layer sequence, for example by means of an etching method, is therefore not necessary for the formation of segments in the semiconductor layer sequence.

The structured deposition of the first semiconductor layer on the second semiconductor layer can be carried out in such a way that the first semiconductor layer also at least regionally covers the side surfaces of the second semiconductor layer. In a departure therefrom, however, the first semiconductor layer can also be deposited on the second semiconductor layer such that the first semiconductor layer is grown only on the second semiconductor layer and not at the side surfaces of the second semiconductor layer.

In accordance with at least one embodiment of the display device, the display device is embodied as a surface mounted device (smd). By way of example, the carrier has contacts for external electrical contacting on the side facing away from the semiconductor layer sequence.

In accordance with at least one embodiment of the display device, at least in part a radiation conversion element is disposed downstream of the pixels in the emission direction. The radiation conversion element can be arranged directly on the associated pixel or arranged at a distance from the pixel. The radiation conversion element is provided in particular for converting primary radiation generated in the active region during the operation of the display device completely or at least partly into secondary radiation. In particular, the display device can be provided for emitting radiation in the red, green and blue spectral range.

In accordance with at least one embodiment, a projection device comprises at least one display device having at least one of the features described above and comprises an optical element disposed downstream of the display device in the emission direction. The optical element can comprise one or a plurality of lenses, for example. The projection device can also comprise more than one display device, for example three display devices, whose emitted radiation lies in mutually different spectral ranges. In this case, the emitted radiation can be superimposed to form a common image by means of the optical element.

In accordance with at least one embodiment, a method for producing a display device comprising a plurality of pixels involves forming a layer stack having a semiconductor layer sequence, which comprises an active region provided for generating radiation and which forms the pixels, and having a circuit layer, in which a switch is formed for each pixel. The circuit layer and the semiconductor layer sequence are deposited one on top of another.

The connection of the pixels of the semiconductor layer sequence to a respectively assigned switch for driving the pixel is therefore carried out in particular by means of deposition processes and structuring processes. By contrast, the production of an aligned bonding connection between a carrier, on which switches are formed, and a further carrier, on which the pixels are formed, is not necessary.

In accordance with at least one embodiment of the method, for forming the circuit layer, an amorphous semiconductor layer is deposited and preferably subsequently recrystallized at least regionally. The recrystallization can be carried out by means of a laser beam, for example, which is guided over the surface of the amorphous layer in a scanning method. The recrystallization can take place over the whole area or only regionally. The recrystallization can also take place in a multi-stage process.

The amorphous semiconductor material is deposited for example by means of a CVD (Chemical Vapor Deposition) method, for instance by means of a PECVD method.

In accordance with at least one embodiment of the method, the circuit layer is deposited on the semiconductor layer sequence. During the deposition of the circuit layer, the semiconductor layer sequence can be formed in an unstructured fashion or in a manner already structured into pixels in a lateral direction. Furthermore, at least one recess extending from the side on which the circuit layer is deposited and through the active region can be formed in the semiconductor layer sequence. Furthermore, further layers can already be deposited on the semiconductor layer sequence, for example a mirror layer and/or one or a plurality of insulation layers and/or one or a plurality of connection layers.

In accordance with at least one embodiment of the method, the semiconductor layer sequence is deposited in a structured fashion in such a way that the pixels are formed during the deposition. A subsequent structuring method for forming individual segments can therefore be dispensed with. In particular, the structured deposition can be carried out in such a way that the first semiconductor layer at least regionally covers a side surface of the second semiconductor layer. The deposition of the second semiconductor layer takes place in particular through openings in a masking layer. By way of example, an oxide layer or a nitride layer is suitable for the masking layer.

Proceeding from the openings, the growth takes place in particular such that the active region has in each case a larger cross section than the associated opening of the masking layer. The deposition of the subsequent first semiconductor layer can be carried out such that the completed first semiconductor layer is embodied in a continuous fashion.

Alternatively, the semiconductor layer sequence can be deposited over the whole area. In the case of a whole-area deposition of the semiconductor layer sequence, the active region can extend continuously over adjacent pixels. If a spatial separation of the pixels is desired, this can subsequently be carried out by means of a structuring method, for instance by means of wet-chemical or dry-chemical etching.

A plurality of display devices can be produced simultaneously by the method described. By way of example, the display devices can be formed in a wafer assemblage which comprises in particular the semiconductor layer sequence and the circuit layer and is subsequently singulated into individual display devices. The singulation is expediently carried out after the pixels have in each case already been electrically conductively connected to a switch of the circuit layer.

The method described is particularly suitable for producing a display device described above. Features mentioned in association with the display device can therefore also be used for the method, and vice-versa.

BRIEF DESCRIPTION OF THE DRAWINGS

In the figures:

FIGS. 1A to 1C show a first exemplary embodiment of a display device in schematic sectional view (FIG. 1A), in a schematic circuit diagram (FIG. 1B) and in a schematic sectional view of an excerpt from the circuit layer (FIG. 1C);

FIGS. 1D and 1E in each case show an exemplary embodiment of a projection device comprising a display device in schematic sectional view;

DETAILED DESCRIPTION OF THE DRAWINGS

Elements that are identical, of identical type or act identically are provided with identical reference signs in the figures.

The figures are in each case schematic illustrations and therefore not necessarily true to scale. Rather, comparatively small elements and in particular layer thicknesses may be illustrated with an exaggerated size for clarification purposes.

Figure 1A:
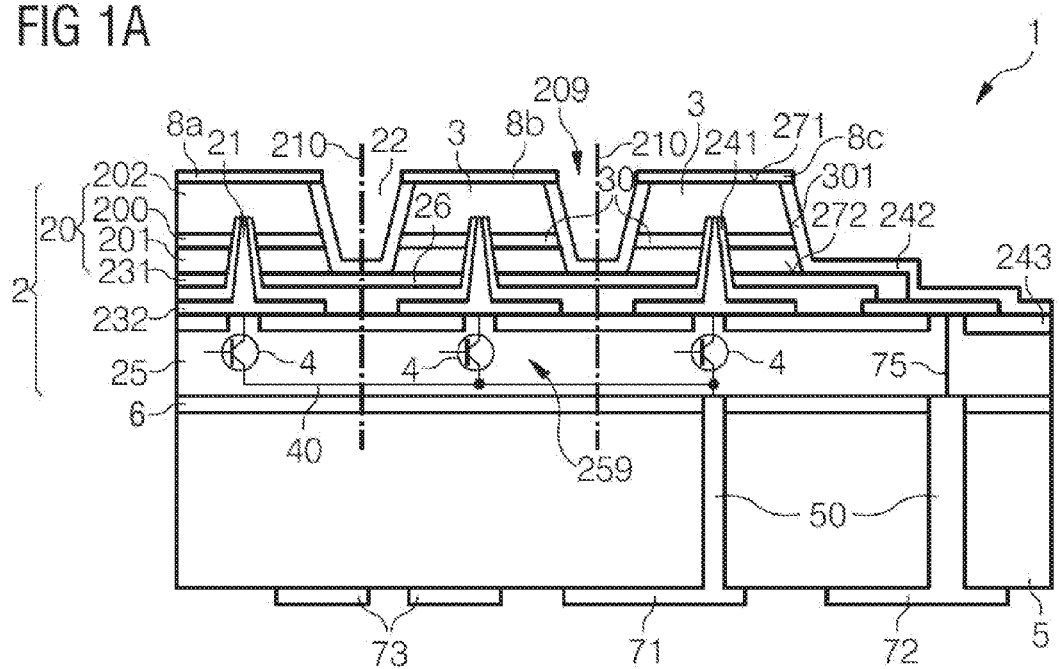
Figure 1B:
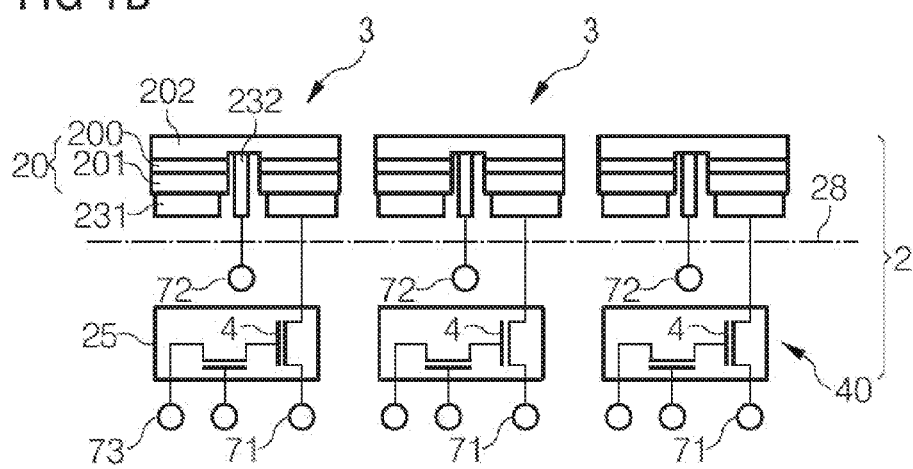

The display device 1 of a first exemplary embodiment designed in accordance with FIGS. 1A to 1C comprises a layer stack 2.

The layer stack 2 comprises a semiconductor layer sequence 20. The semiconductor layer sequence comprises an active region 200 arranged between a p-conducting first semiconductor layer 201 and an n-conducting second semiconductor layer 202. However, the semiconductor layers can also be inverted with regard to their polarity. The semiconductor layer sequence 20, in particular the active region 200, is based on a III-V semiconductor material and is provided for generating radiation in the ultraviolet, visible or infrared spectral range.

In a vertical direction, the semiconductor layer sequence extends between a radiation exit surface 271 and a rear side 272 situated opposite the radiation exit surface.

In a lateral direction, that is to say in a direction running along a main extension plane of the semiconductor layers of the semiconductor layer sequence 20, the active region 200 is subdivided into a plurality of segments 30 which each form a pixel. The display device comprises a plurality of pixels arranged in a matrix-shaped fashion in a plurality of columns and a plurality of rows. A respective trench 22 extending completely through the semiconductor layer sequence 20 in a vertical direction is formed between adjacent segments 30. The side surfaces 301 of the segments are in each case provided with a second insulation layer 242. Said second insulation layer serves as a passivation layer and protects in particular the active region 200 exposed at the side surfaces.

The layer stack 2 furthermore comprises a circuit layer 25. A drive circuit 40 is formed by means of the circuit layer 25. The drive circuit 40 comprises in each case a switch 4 for each pixel. During the operation of the display device, the pixels 3 can in each case be driven via the switches, such that all the pixels of the display device 1 can be driven independently of one another and operated simultaneously.

The circuit layer 25 preferably contains a polycrystalline semiconductor material, for example polycrystalline silicon. The switches can be embodied in particular as thin-film transistors, for example as MOSFETs.

The layer stack 2 furthermore comprises a first connection layer 231. The first connection layer is provided for making electrical contact with the first semiconductor layer 201. In the case of the exemplary embodiment illustrated in FIG. 1A, the first connection layer 231 extends continuously over all the pixels 3 of the display device and forms a common contact for the pixels 3.

The first connection layer 231 is furthermore embodied as a mirror layer 26. Radiation which is generated in the active region 200 during the operation of the display device and is emitted in the direction of the circuit layer 25 can be reflected at the mirror layer and deflected in the direction of the radiation exit surface. The risk of absorption of radiation in the circuit layer is thus avoided.

The layer stack 2 furthermore comprises a second connection layer 232. The second connection layer 232 is provided for making electrical contact with the second semiconductor layers 202 of the pixels 3.

In the case of the exemplary embodiment illustrated in FIG. 1A, the switches 4 are electrically conductively connected to the second semiconductor layer 202 of the assigned pixel 3 in each case by means of the second connection layer 232. In the semiconductor layer sequence 20, a recess 21 extending from the rear side 272 through the first semiconductor layer 201 and the active region 200 into the second semiconductor layer 202 is formed in each pixel 3. The second connection layer 232 is in each case connected to the second semiconductor layer 202 in the recesses 21. In order to avoid an electrical short circuit, a first insulation layer 241 is formed between the second connection layer 232 and the active region 200 and between the second connection layer and the first semiconductor layer 201. The first insulation layer 241 is furthermore arranged between the first connection layer 231 and the second connection layer 232.

The lateral structure of the semiconductor layer sequence 20 and of the circuit layer 25 has in each case a unit cell 209 and 259, respectively. The structure of the unit cells is repeated periodically in a lateral direction. The lateral extent of the unit cell 209 is illustrated by the lines 210. The lateral extent of the unit cell 259 of the circuit layer 25 is equal to the unit cell 209 of the semiconductor layer sequence 20. The distance between adjacent pixels 3 is therefore determined only by means of the lateral extent of the pixels 3 and not by means of the space requirement for the drive circuit per pixel 3.

In particular, each pixel 3 completely covers the respectively assigned switch 4 in a plan view of the display device.

The integration of the semiconductor layer sequence 20 and of the circuit layer 25 into the common layer stack 2 realizes, in a simple manner, a display device in which even very small pixels can be electrically driven reliably and simultaneously. An aligned bonding step between a semiconductor layer sequence structured into pixels and a carrier into which a drive circuit is integrated can be dispensed with during production.

The lateral extent of the pixels is thus variable within wide limits. In particular, the lateral extent of the pixels is between 2 µm and 300 µm inclusive, preferably between 2 µm and 50 µm inclusive, particularly preferably between 2 µm and 10 µm inclusive.

The radiation exit surface 271 is furthermore free of electrical contact-connections. The risk of shading by radiation-nontransmissive layers, for example metallic contact layers, is thus avoided.

In the exemplary embodiment shown, the layer stack 2 is cohesively fixed to a carrier 5 by means of a connecting layer 6, for example an adhesive layer. The carrier is preferably embodied as electrically insulating. By way of example, the carrier can contain a ceramic, for instance an aluminum-containing ceramic such as aluminum nitride of $Al_2O_3$, or boron nitride, or can consist of such a material. A semiconductor material, for example silicon or germanium, can also be employed for the carrier.

Perforations 50 are formed in the carrier 5. On a rear side facing away from the layer stack 2, the carrier 5 has a first contact 71, a second contact 72 and further contacts 73 for the external electrical contacting of the display device. The second contact 72 can be embodied as a ground contact, for example. The first connection layer 231 is electrically conductively connected to the second contact 72 via a lead 75. The operating voltage for the pixels can be fed via the first contact.

The display device is free of a growth substrate for the epitaxial deposition of the semiconductor layer sequence 20. The growth substrate can therefore be chosen independently of its optical properties. Particularly in the case of a radiation-transmissive growth substrate, however, the growth substrate can also remain at least partly, for instance in a thinned form, in the finished display device.

The display device 1 is embodied as surface-mountable. The display device is electrically contacted exclusively via its rear side. Front-side contacts can therefore be dispensed with.

FIG. 1B shows a schematic circuit diagram illustrating the interconnection of the individual pixels 3. A horizontal line 28 illustrates the separation between the semiconductor layer sequence 2 having the connection layers and the circuit layer 25 having the drive circuit 40. In contrast to the configuration variant illustrated in FIG. 1A, in the case of the configuration variant illustrated in FIG. 1B, the first semiconductor layer 201 of the respective pixels 3 is electrically conductively connected to the respectively assigned switches 4 by means of the first connection layer 231. The second semiconductor layer 202 of the pixels is electrically conductively connected to the common second contact 72 by means of the second connection layer 232. The electrically conductive connection to the common contact can be effected by means of a continuous configuration of the second connection layer 232, in a similar manner to that as in FIG. 1A, or by means of the drive circuit 40, as indicated in FIG. 1B.

Control signals that control the respective switches 4 of the pixels 3 can be fed via the further contacts 73. In particular, the contacts 73 can serve as input for optical image data which are fed to the switches 4 for example via a shift register (not shown) contained in the circuit layer 25.

The number of contacts 73 can be very much smaller than the number of pixels, in particular smaller than the sum formed by the number of rows and the number of columns of the matrix-shaped display device.

An excerpt from the circuit layer 25 is illustrated schematically in FIG. 1C. Cutouts 250 are in each case provided in the circuit layer 25, said cutouts extending completely through the circuit layer 25 in a vertical direction. The cutouts 250 are provided for the production of an electrically conductive connection to the pixels, in FIG. 1C by way of example for producing an electrically conductive connection to the second connection layer 232. A third insulation layer 243 is formed between the semiconductor layer sequence 20 and the circuit layer 25, in particular between the second connection layer 232 and the circuit layer 25.

A fourth insulation layer 244 is formed on that side of the circuit layer 25 which faces away from the semiconductor layer sequence 20. A gate electrode 41 of the switch 4 is formed on that side of the fourth insulation layer 244 which faces away from the circuit layer 25. The switch furthermore comprises further electrodes 42. One of the further electrodes 42, for instance a source electrode or a drain electrode, of the switch 4 is electrically conductively connected to the second connection layer 232 by means of a lead layer 43. The lead layer extends in a vertical direction through the circuit layer 25 and the third insulation layer 243. The further electrodes 42 in each case adjoin a doped region 252 of the circuit layer 25. In a plan view of the display device, the gate electrode is arranged between the doped regions 252.

It goes without saying that the drive circuit 40 can comprise even further components, for example capacitors, for instance for forming a sample-and-hold circuit, driver components, circuit elements and/or shift registers. In particular, some of these elements can be assigned to a plurality or all of the pixels, rather than to an individual pixel alone.

By way of example, an oxide, for instance silicon oxide, a nitride, for instance silicon nitride, or an oxynitride, for instance silicon oxynitride, is suitable for the insulation layers, in particular the first insulation layer 241, the second insulation layer 242, the third insulation layer 243 and the fourth insulation layer 244. The numbering of the individual insulation layers serves merely for simplified description and does not imply any restriction with regard to the order of production or the number of insulation layers present. By way of example, a CVD (chemical vapor deposition) method, for instance vapor deposition or an ALD (atomic layer deposition) method, or a PVD (physical vapor deposition) method, for instance sputtering, is suitable for forming the insulation layers.

The first connection layer 231 and the second connection layer 232 can contain a metal and/or a TCO material. The first connection layer 231 is preferably embodied as a mirror layer 26 for the radiation generated in the active region 200. By way of example, the mirror layer contains silver, aluminum, rhodium, palladium, nickel or chromium. These materials are distinguished by a high reflectivity in the visible spectral range and in the ultraviolet spectral range. By way of example, a mirror layer which contains gold or consists of gold is suitable for the infrared spectral range.

Optionally, as illustrated in FIG. 1A, radiation conversion elements 8a, 8b, 8c can in each case be disposed downstream of the pixels 3 in the emission direction. By way of example, the semiconductor layer sequence 20, in particular the active region 200, can emit primary radiation in the ultraviolet spectral range during operation, said primary radiation being converted in particular completely into secondary radiation in the blue, red and respectively green spectral range by means of the radiation conversion elements 8a, 8b, 8c. Alternatively, the primary radiation can lie in the blue spectral range. The radiation conversion element 8a can be dispensed with in this case. It goes without saying that such radiation conversion elements can also be employed in the case of the exemplary embodiments described below. For the sake of simplified illustration, however, these are not shown in the further figures.

FIGS. 1D and 1E in each case show an exemplary embodiment of a projection device 10. Details of the display device 1, which can be embodied as described in association with FIGS. 1A to 1C and with the subsequent figures, are not shown, for the sake of simplified illustration. The projection device 10 comprises in each case an optical element 9 in the beam path of the display device 10.

In the case of the exemplary embodiment illustrated in FIG. 1D, the pixels of the display device respectively comprise radiation conversion elements 8a, 8b, 8c, which convert the radiation generated during operation, as described above. In this case, the number of pixels of the display device is three times the magnitude of the number of optically representable pixels, such that a full-color image arises during the operation of the projection device.

In contrast to the exemplary embodiment illustrated in FIG. 1D, the projection device 10 comprises three display devices 1 each provided for generating radiation in one wavelength range. The number of pixels of the display devices is in each case equal to the number of optically representable pixels. A radiation conversion element 8a, 8b, 8c, common to the entire display device is in each case arranged in the beam path of the display devices. The radiation emitted by the display devices 1 is superimposed to form a common full-color image by means of a superimposing arrangement 91. The superimposing arrangement can be formed for example by means of crossed prisms coated in a dichroic fashion.

Figure 2:
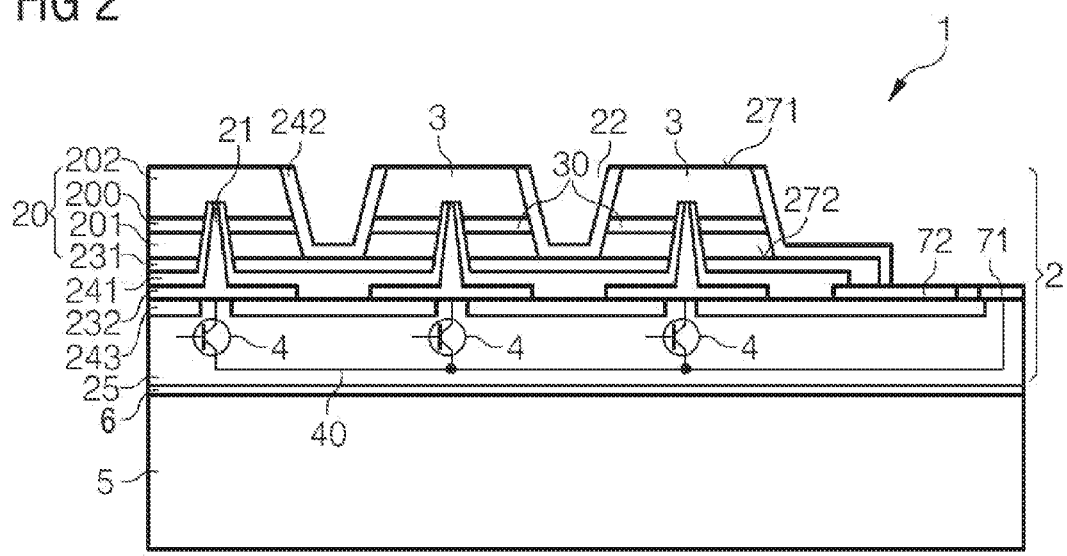
FIGS. 2 and 3 show a second and respectively third exemplary embodiment of a display device in schematic sectional view.

The second exemplary embodiment illustrated in FIG. 2 substantially corresponds to the first exemplary embodiment described in association with FIG. 1. In contrast thereto, the display device 1 is embodied as a component which can be externally electrically contacted on the front side, rather than on the rear side. The first contact 71, the second contact 72 and the further contacts 73 (not explicitly illustrated) are therefore arranged on the same side of the circuit layer 25 as the semiconductor layer sequence 20. Such a configuration of the display device is also suitable for the exemplary embodiments described below.

Figure 3:
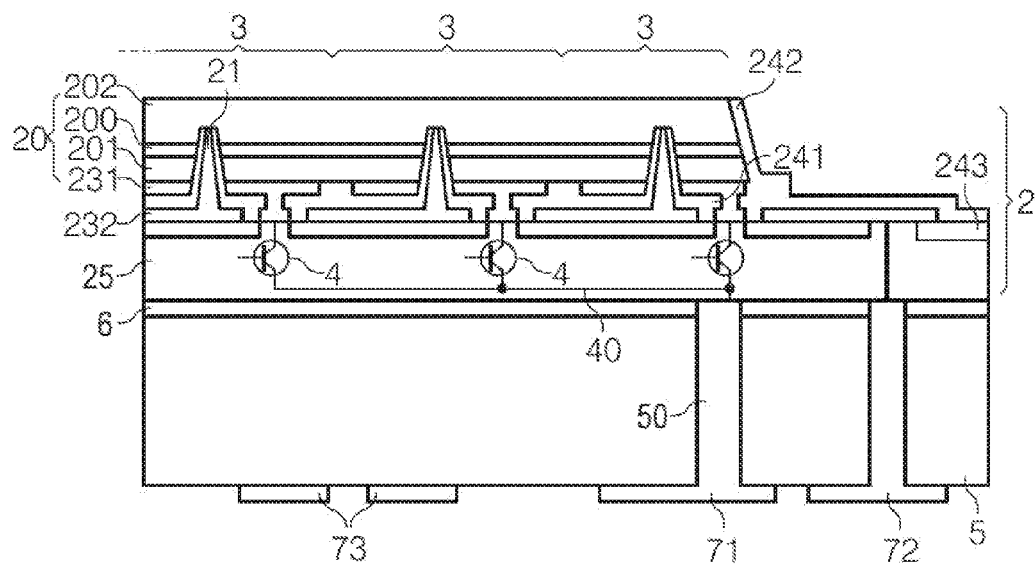

The third exemplary embodiment illustrated in FIG. 3 differs from the first exemplary embodiment described in association with FIGS. 1A to 1C in particular in that no trenches are formed between adjacent pixels 3. The semiconductor layer sequence 20 therefore extends continuously over the pixels. A structuring step for forming individual segments of the active region 200 can be dispensed with. Such a continuous semiconductor layer is suitable, in particular, if the transverse conductivity of the first or second semiconductor layer connected to the switch 4 is so low that the lateral extent of the region in which radiation is emitted in the case of a charge carrier injection is substantially determined by the extent of the associated connection layer. In the case of a semiconductor layer sequence based on AlInGaN, the p-conducting semiconductor material typically has a lower transverse conductivity than the n-conducting semiconductor material, such that the continuous semiconductor layer connected to the switch 4 is expediently embodied as p-conducting.

The individual pixels are electrically contacted as described in association with FIG. 1B. The first semiconductor layer 201 is therefore electrically conductively connected in each case to the assigned switches 4 by means of the first connection layer 231. The second connection layer 232 forms a common contact for all the pixels 3 of the display device 1.

Figure 4A:
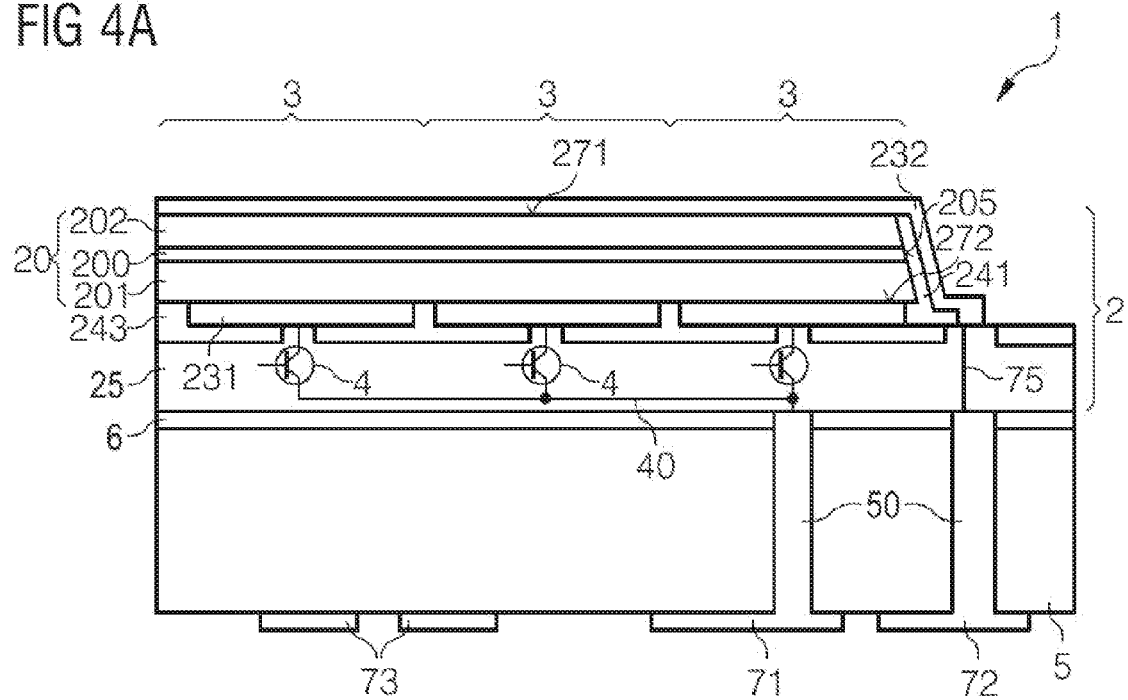
FIGS. 4A and 4B show a fourth exemplary embodiment of a display device on the basis of a schematic sectional view (FIG. 4A) and a schematic circuit diagram (FIG. 4B)
Figure 4B:
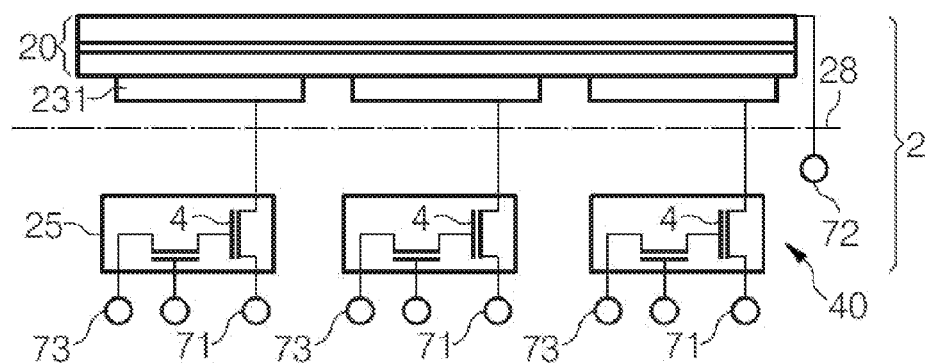

The fourth exemplary embodiment illustrated in FIGS. 4A and 4B substantially corresponds to the third exemplary embodiment described in association with FIG. 3. In contrast thereto, the semiconductor layer sequence 20 is free of the recesses 21 extending through the active region 200. The semiconductor layer sequence 20 is therefore totally unstructured in a lateral direction. For making electrical contact with the second semiconductor layer 202, the second connection layer 232 extends over the radiation exit surface 271 and, laterally with respect to the semiconductor layer sequence 20, is led over a side surface 205 delimiting the semiconductor layer sequence in a lateral direction. In order to avoid an electrical short circuit, the side surface 205 is covered with a first insulation layer 241 at least at the level of the active region 200 and at the level of the first semiconductor layer 201. The first insulation layer 241 is arranged between the side surface 205 and the second connection layer 232. In this exemplary embodiment, the second connection layer 232 preferably contains a TCO material, for instance ITO or ZnO.

The schematic circuit diagram illustrated in FIG. 4B corresponds to the schematic circuit diagram illustrated in FIG. 1B, apart from the contacting of the second semiconductor layer 202 with the common contact 72.

Figure 5A:
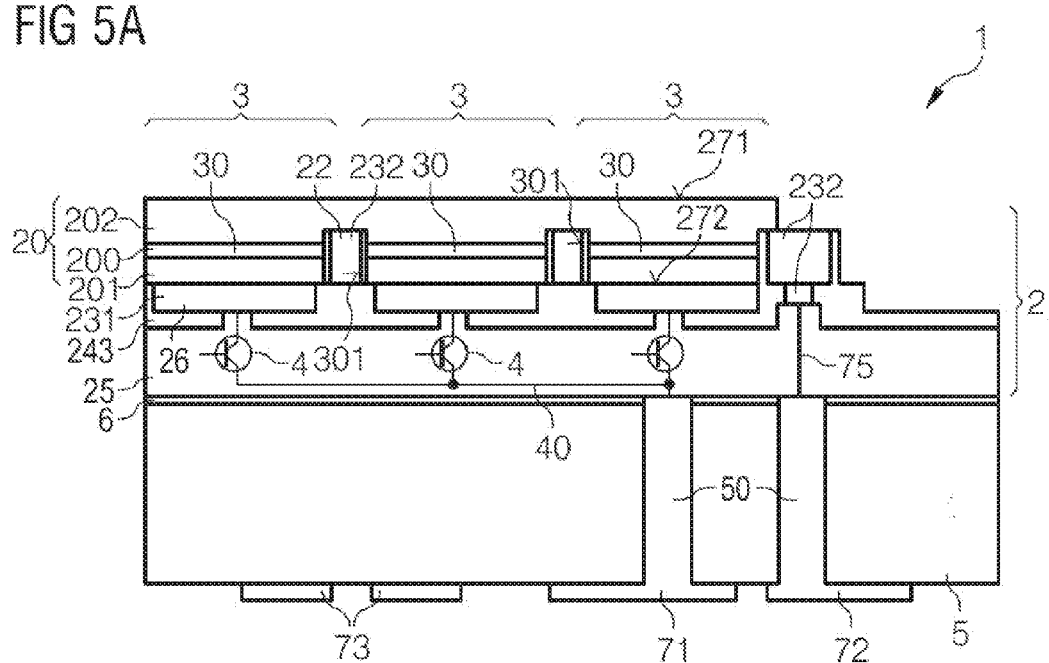
FIGS. 5A and 5B show a fifth exemplary embodiment of a display device on the basis of a schematic sectional view (FIG. 5A) and a schematic circuit diagram (FIG. 5B)
Figure 5B:
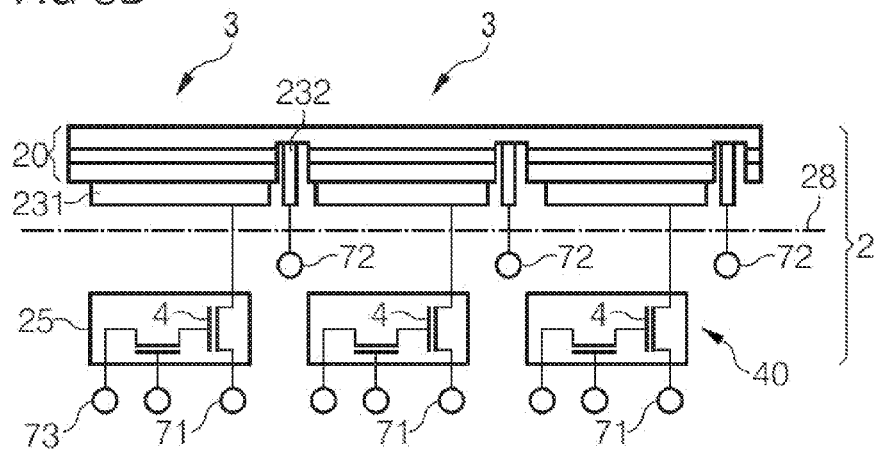

The fifth exemplary embodiment illustrated in FIGS. 5A and 5B substantially corresponds to the first exemplary embodiment described in association with FIGS. 1A to 1C. In particular, the switches 4 are in each case electrically conductively connected to the first semiconductor layer 201 of the pixels 3 by means of the first connection layer 231, as described in association with FIG. 1B.

In contrast to the first exemplary embodiment, the second semiconductor layer 202 is electrically contacted via the trenches 22 formed between the pixels 3. The trenches extend through the first semiconductor layer 201 and the active region 200 and end in the second semiconductor layer. The second connection layer 232 is electrically conductively connected to the second semiconductor layer 202 in the trenches. Therefore, the second semiconductor layer is contacted in each case along the circumference of the pixels. The second connection layer regionally covers the side surface 301 of the segments 30. In a plan view of the display device, the second connection layer assumes the form of an in particular metallic lattice. A recess through the active region 200 provided in addition to the trenches can therefore be dispensed with. The area of the mirror layer 26 is thus enlarged by comparison with a configuration having a recess in the semiconductor layer sequence.

In order to avoid an electrical short circuit, a first insulation layer 241 is formed between the second connection layer 232 and the active region 200.

The second connection layer 232 can be embodied as radiation-transmissive or radiation-nontransmissive. In the case of a radiation-nontransmissive configuration, for example by means of a metal layer, it is possible to suppress or at least reduce the optical crosstalk between adjacent pixels by means of the second connection layer 232.

The schematic circuit diagram illustrated in FIG. 5B corresponds to the schematic circuit diagram illustrated in FIG. 1B, apart from the marginal contacting of the second semiconductor layer 202.

Figure 6A:
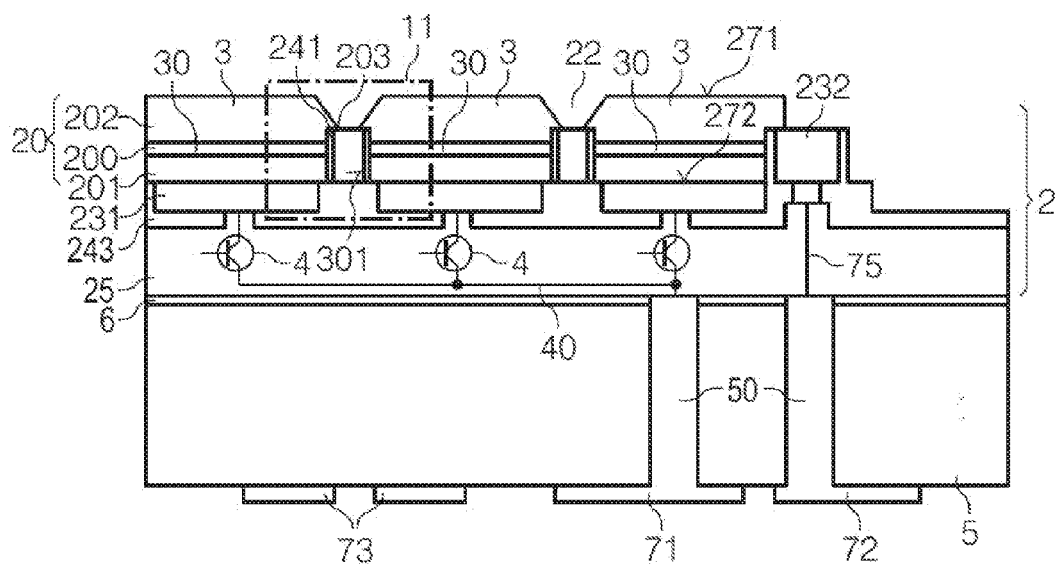
FIGS. 6A to 6C show a sixth exemplary embodiment of a display device on the basis of a schematic sectional view in FIG. 6A and on the basis of two configuration variants, a respective excerpt from which is shown in FIGS. 6B and 6C.
Figure 6B:
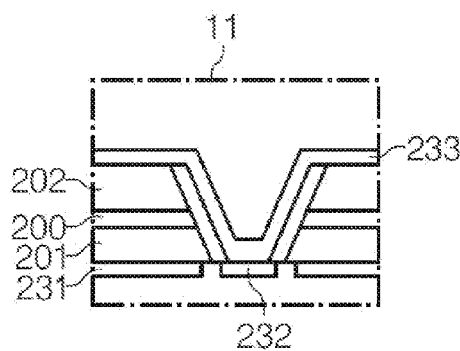
Figure 6C:
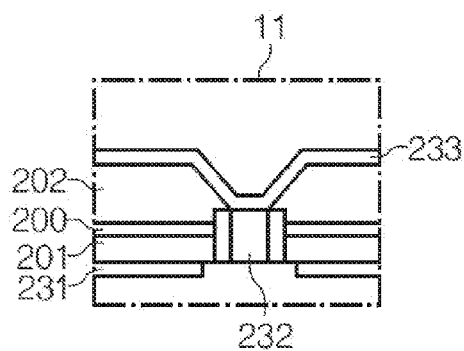

The sixth exemplary embodiment comprising three configuration variants as illustrated in FIGS. 6A to 6C substantially corresponds to the fifth exemplary embodiment described in association with FIGS. 5A and 5B. In contrast thereto, the trenches 22 extend completely through the semiconductor layer sequence 20 in a vertical direction. The optical crosstalk between adjacent pixels can thus be reduced even more extensively.

In the case of the configuration variant illustrated in FIG. 6A, the second semiconductor layer 202 has a projection 203. The projection regionally covers the second connection layer 232. A reliable electrical contact between the second connection layer and the second semiconductor layer is thus simplified. The first insulation layer 241 extends in the direction of the radiation exit surface 271 as far as the projection 203.

In the case of the configuration variant illustrated in FIG. 6C, the second connection layer 232 additionally comprises a further partial layer 233. The further partial layer, as described in association with FIG. 4A, can be formed over the whole area on the radiation exit surface 271 and, in the region of the trenches, can adjoin the partial layer of the second connection layer which is arranged in the trenches. A laterally uniform energization of the pixels can be simplified more extensively as a result.

In the case of the configuration variant illustrated in FIG. 6B, the further partial layer 233 extends in each case over the entire side surface 301 of the segment 30. Furthermore, the first insulation layer 241 completely covers the side surface of the segment.

Figure 7:
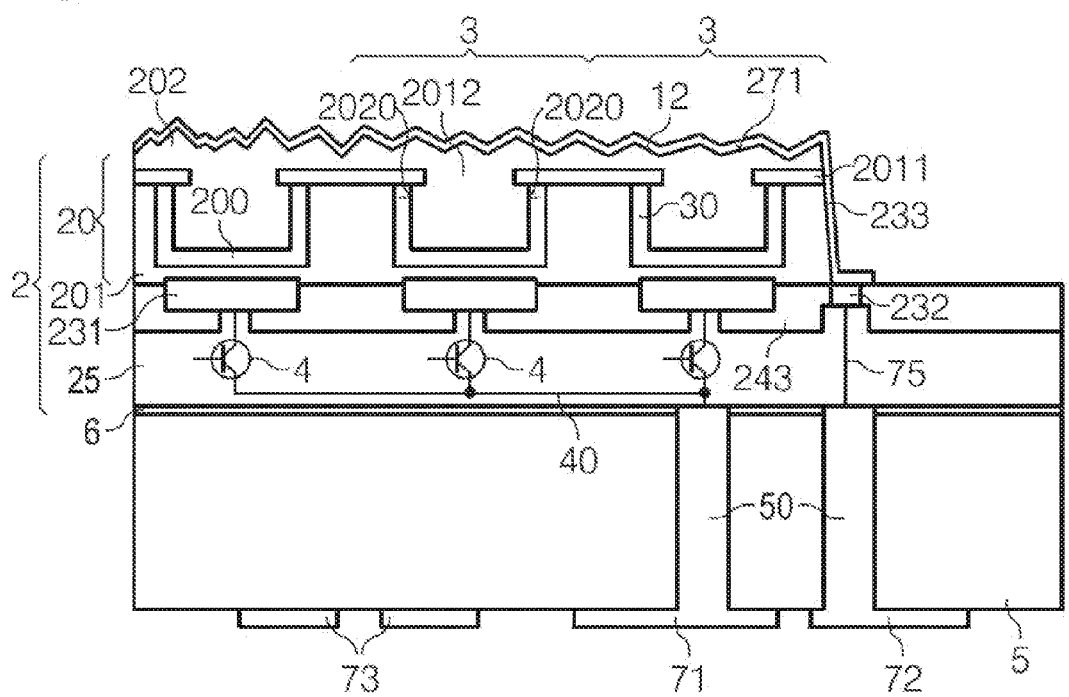
FIG. 7 shows a seventh exemplary embodiment of a display device in schematic sectional view.

In the case of the seventh exemplary embodiment illustrated in FIG. 7, the electrical contacting of the individual pixels 3 corresponds to the fourth exemplary embodiment described in association with FIGS. 4A and 4B. In the case of the exemplary embodiment illustrated in FIG. 7, in contrast to the previous exemplary embodiments, the deposition of the semiconductor layer sequence 20 is carried out in such a way that the lateral structuring of the semiconductor layer sequence already arises during the epitaxial deposition. For this purpose, a masking layer 2011 is applied during the epitaxial deposition. The second semiconductor layer grows through the openings 2012 of the masking layer. The position of the later pixels is therefore already defined by means of the masking layer. In particular, each pixel is assigned exactly one opening. In cross section, the active region 200 has a U-shaped structure delimited by the masking layer 2011 in a vertical direction. A subsequent structuring for severing the active region 200, for example by means of a wet-chemical or dry-chemical method, can therefore be dispensed with. Defects which can occur during such a structuring process and can reduce the radiation power of the individual pixels can be avoided as a result.

In the exemplary embodiment illustrated, the active region 200 and the first semiconductor layer 201 are deposited on the second semiconductor layer 202 such that the first semiconductor layer 201 projects beyond the second semiconductor layer 202 in a lateral direction. In particular, the side surfaces 2020 of the second semiconductor layer 202 are covered by the active region 200 and the first semiconductor layer 201. The area of the active region 200 that can be utilized for the generation of radiation can be enlarged by means of the type of deposition described.

Both the first semiconductor layer 201 and the second semiconductor layer 202 regionally adjoin the masking layer 2011. The first semiconductor layer 201 extends continuously over adjacent pixels 3. During production, therefore, the growth of the first semiconductor layer 201 takes place such that the partial regions of said layer that are initially laterally separated from one another coalesce.

The opening 2012 of the masking layer 2011 and the respective first connection layer 231 of the pixel 3 overlap in a plan view of the display device 1.

Furthermore, in the exemplary embodiment shown, the radiation passage surface has a structuring 12 for increasing the coupling-out efficiency. The structuring can be a roughening, for example. Such a structuring can also be employed in the exemplary embodiments described above.

One exemplary embodiment of a method for producing a display device is shown in FIGS. 8A to 8E on the basis of intermediate steps illustrated schematically in sectional view. The production of the display device is effected by way of example for a display device embodied as described in association with FIGS. 1A to 1C.

The figures in each case show only an excerpt of one display device. During production, a multiplicity of display devices of identical type can be produced alongside one another in a wafer assemblage. After the conclusion of the production method, the wafer assemblage can be singulated into a plurality of display devices.

Figure 8A:
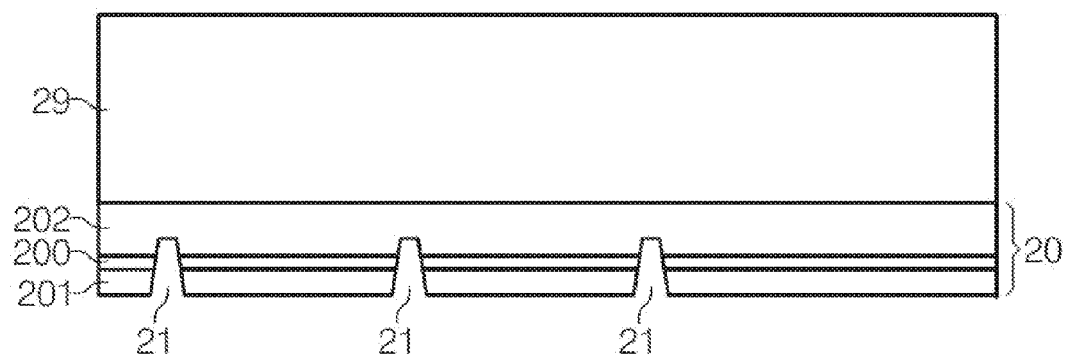
FIGS. 8A to 8E show an exemplary embodiment of a method for producing a display device on the basis of intermediate steps illustrated in each case in schematic sectional view.

As illustrated in FIG. 8A, a semiconductor layer sequence 20 having an active region 200, a first semiconductor layer 201 and a second semiconductor layer 202 is deposited on a growth substrate 29 epitaxially, for instance by means of MOVPE or MBE. After the epitaxial deposition, a plurality of recesses 21 are formed, wherein the recesses extend though the first semiconductor layer 201 and the active region 200 into the second semiconductor layer 202.

A first connection layer 231 is deposited on that side of the semiconductor layer sequence 20 which faces away from the growth substrate 29. Alternatively, the recesses 21 can also be formed after the deposition of the first connection layer 231.

On that side of the semiconductor layer sequence 20 which faces away from the growth substrate 29, a first insulation layer 241 is formed in a structured fashion in such a way that the second semiconductor layer 202 is at least partly exposed in the region of the recesses 21.

Afterward, a second connection layer 232 is deposited on the first insulation layer 241 and structured laterally. The second connection layer adjoins the second semiconductor layer 202 in the region of the recesses 21.

Figure 8B:
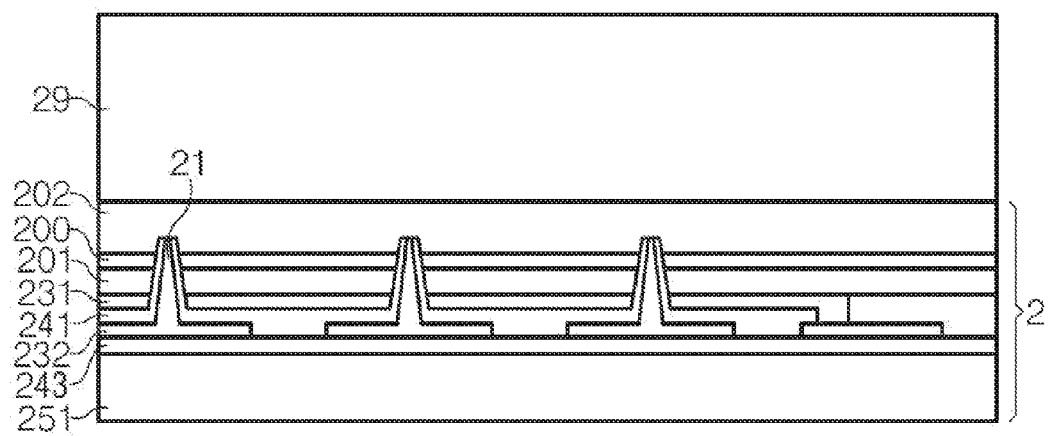

A third insulation layer 243 is deposited onto the connection layers 231, 232. Afterward, an amorphous semiconductor layer 251 is deposited, for example by means of a PECVD method. The layer stack 2 thus formed is shown in FIG. 8B.

In order to increase the charge carrier mobility, the amorphous semiconductor layer 251 is recrystallized at least regionally. This can be carried out for example by scanning the surface with a laser beam.

Figure 8C:
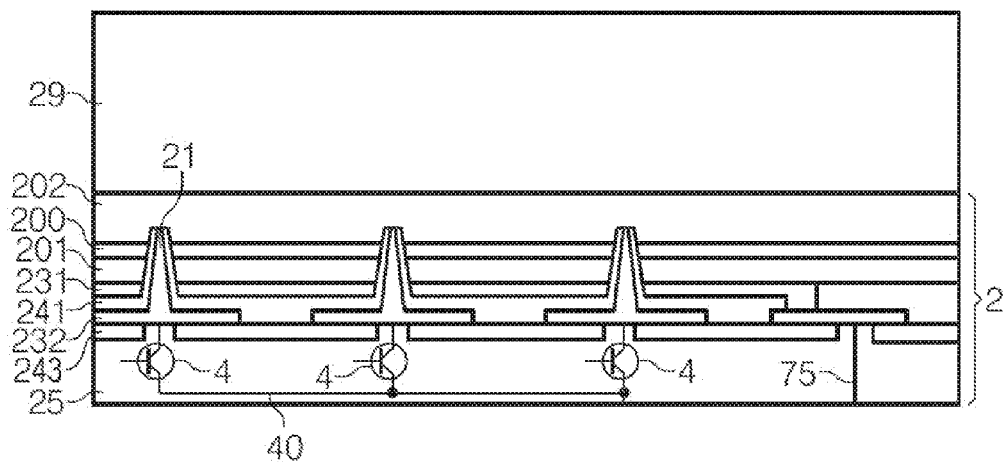

By means of the circuit layer 25 thus formed, a drive circuit 40 having a plurality of switches 4 is formed, as shown in FIG. 8C. For the sake of simplified illustration, the additional insulation and metallization layers provided for the formation of the drive circuit, for instance for the formation of the gate electrodes and the further electrodes of the switches 4 (cf. FIG. 1C), are not explicitly illustrated in FIG. 8C. Forming the circuit layer 25 having the drive circuit 40 comprises in particular:

exposing the first connection layer 231 and the second connection layer 232;

depositing electrodes 42 for the switches, for instance source electrode and drain electrodes, and connecting the electrodes to the associated connection layers; and depositing an oxide layer (fourth insulation layer 244 in FIG. 1C), on which the gate electrode 41 is subsequently applied.

Furthermore, forming the circuit layer can also comprise forming doped regions 252, for instance by ion implantation.

Figure 8D:
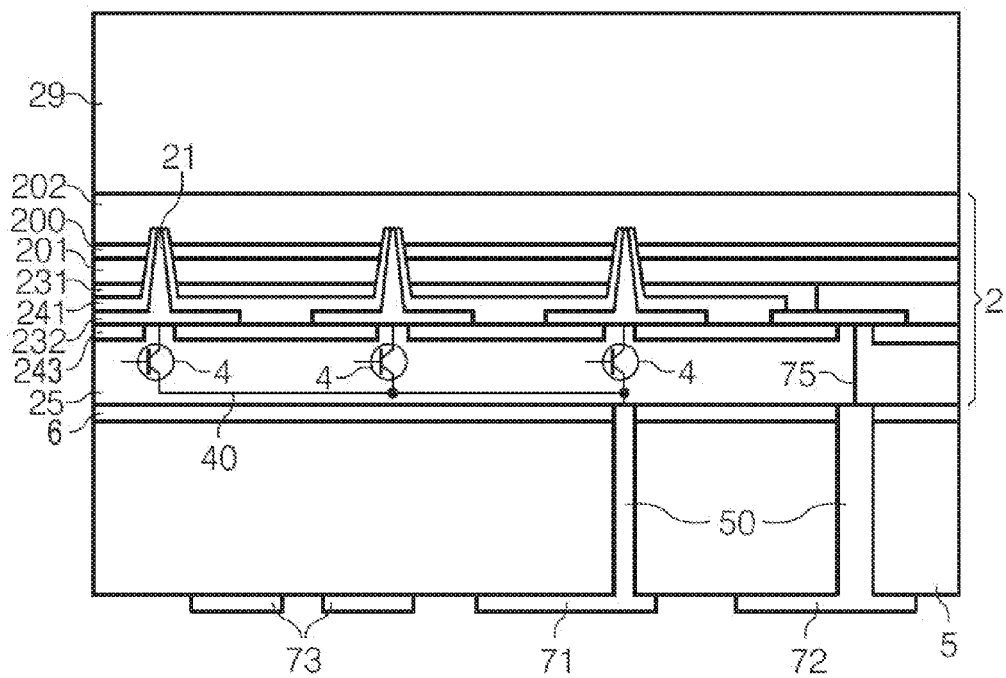
Figure 8E:
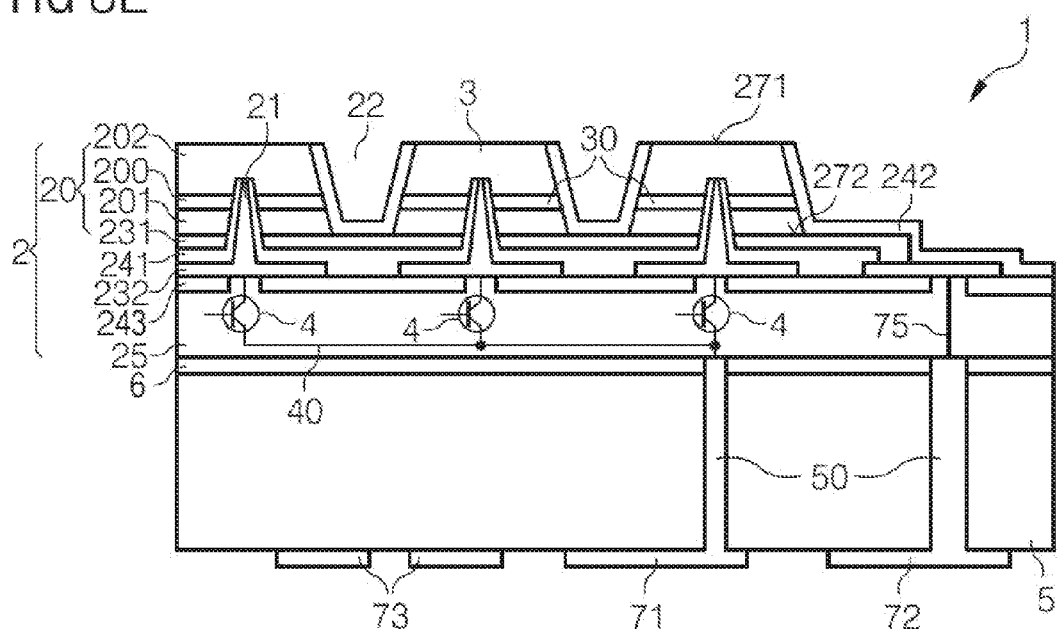

After the drive circuit 40 has been formed, the layer stack 2 is fixed to a carrier 5 by means of a connecting layer 6 (FIG. 8D). The individual pixels of the display device are therefore already assigned a respective switch even before the fixing to the carrier 5 is carried out. For electrically contacting the display device from that side of the carrier 5 which faces away from the layer stack 2, a first contact 71, a second contact 72 and further contacts 73 are formed at the rear side of the carrier 5. Said contacts are electrically conductively connected to the circuit layer 25 via perforations 50. The perforations 50 can be formed before or after the fixing of the carrier 5 to the layer stack 2.

After the layer stack 2 has been fixed to the carrier 5, the growth substrate 29 is removed. This can be carried out for example mechanically, for instance by means of grinding, lapping or polishing, and/or chemically, for instance by means of wet-chemical or dry-chemical etching, or by means of a laser lift-off method (LLO). In order to subdivide the active region 200 into individual segments 30, trenches 22 are formed, for instance by means of wet-chemical or dry-chemical etching. In a departure from the exemplary embodiment described, the trenches 22 can also be formed before the layer stack 2 is fixed to the carrier 5, in particular even before the third insulation layer 243 and the amorphous semiconductor layer 251 are formed.

In order to produce a display device in which the active region 200 is not subdivided into segments 30, the process of forming the trenches 22 can also be completely dispensed with.

After the process of forming the trenches, the side surfaces of the segments 301, in particular the exposed parts of the active region 200, are provided with a second insulation layer 242.

In a departure from the exemplary embodiment described, the growth substrate 29 can also remain completely or partly, for instance in a thinned form, in the display device.

The production method described can be used to produce display devices in which the radiation-generating semiconductor layers, in particular the active region 200, and the layers provided for electrical driving, in particular the circuit layer 25, are integrated into a common layer stack. A complex bonding process in which prefabricated pixels and a prefabricated drive circuit have to be positioned highly accurately with respect to one another, that is to say with an alignment accuracy of less than or equal to the center-to-center distance between adjacent pixels, is therefore not necessary. In comparison therewith, only comparatively minor alignment requirements are made of the fixing of the layer stack 2 to the carrier 5 and said requirements are largely independent of the size of the individual pixels.

This patent application claims the priority of German patent application 10 2012 112 302.0, the disclosure content of which is hereby incorporated by reference.

The invention is not restricted by the description on the basis of the exemplary embodiments. Rather, the invention encompasses any novel feature and also any combination of features, which in particular includes any combination of features in the patent claims, even if this feature or this combination itself is not explicitly specified in the patent claims or the exemplary embodiments.

The invention claimed is:

1. A display device having a layer stack, which comprises a semiconductor layer sequence having an active region provided for generating radiation and comprises a circuit layer,
   wherein the semiconductor layer sequence forms a plurality of pixels and a switch is formed in the circuit layer for each pixel, the switch being electrically conductively connected to the respective pixel,
   wherein the active region is subdivided into individual segments each forming a pixel,
   wherein the segments are electrically contacted along a circumference of the segments, and
   wherein the display device is free of a cohesive connection between the semiconductor layer sequence and the circuit layer.

2. The display device according to claim 1, wherein the circuit layer comprises a polycrystalline semiconductor material or an amorphous semiconductor material having a charge carrier mobility of at least 100 cm$^2$/Vs for at least one charge carrier type.

3. The display device according to claim 1, wherein the semiconductor layer sequence and the circuit layer comprise along a lateral direction in each case a periodically repeating structure having a unit cell, and
   wherein in the lateral direction an extent of the unit cell of the circuit layer is equal to an extent of the unit cell of the circuit layer.

4. The display device according to claim 1, wherein the pixels in each case completely cover the assigned switches in a plan view of the display device.

5. The display device according to claim 1, wherein the layer stack comprises a mirror layer arranged between the semiconductor layer sequence and the circuit layer.

6. The display device according to claim 1, wherein the semiconductor layer sequence is fixed to a carrier and the circuit layer is arranged between the semiconductor layer sequence and the carrier.

7. The display device according to claim 1, wherein the active region extends continuously over the pixels.

8. The display device according to claim 1, wherein the active region is subdivided into individual segments each forming a pixel.

9. The display device according to claim 8, wherein the segments are electrically contacted along a circumference of the segments.

10. The display device according to claim 1, wherein the semiconductor layer sequence has at least one recess which extends from the circuit layer through the active region.

11. The display device according to claim 10, wherein each pixel has at least one recess which extends from the circuit layer through the active region.

12. The display device according to claim 1, wherein the pixels on one side of the active region are connected to a common connecting layer.

13. The display device according to claim 12, wherein the common connection layer extends over the whole area over a radiation exit surface of the semiconductor layer sequence.

14. The display device according to claim 1, wherein the active region is formed between a first semiconductor layer and a second semiconductor layer, and the first semiconductor layer at least regionally covers a side surface of the second semiconductor layer.

15. The display device according to claim 1, wherein at least in part a radiation conversion element is disposed downstream of the pixels in the emission direction.

16. A projection device comprising a display device according to claim 1 and comprising an optical element disposed downstream of the display device in the emission direction.

17. The display device according to claim 1, further comprising:
   a connection layer for electrically connecting the pixels,
   wherein the connection layer runs at least in regions between the active regions of two adjacent segments.

18. The display device according to claim 1, further comprising:
   a connection layer provided for electrically conductively connecting the pixels,
   wherein the connection layer covers a side face of the active regions.

19. A display device having a layer stack, which comprises a semiconductor layer sequence having an active region provided for generating radiation and comprises a circuit layer,
   wherein the semiconductor layer sequence forms a plurality of pixels and a switch is formed in the circuit layer for each pixel, the switch being electrically conductively connected to the respective pixel,
   wherein the display device is free of a cohesive connection between the semiconductor layer sequence and the circuit layer,
   wherein the semiconductor layer sequence comprises a first semiconductor layer and a second semiconductor layer,
   wherein the active region is arranged between the first semiconductor layer and the second semiconductor layer,
   wherein the active region is subdivided into a plurality of segments each segment forming one pixel,
   wherein the second semiconductor layer is electrically contacted by means of a connection layer, and
   wherein the connection layer extends in a lateral direction at least in regions between active regions of two adjacent segments.

20. The display device according to claim 18, wherein the connection layer does not cover a center of the active regions.

21. The display device according to claim 19, wherein the connection layer electrically connects to the second semiconductor layer laterally beside the active region.

* * * * *